(12) United States Patent
He et al.

(10) Patent No.: US 12,148,801 B2
(45) Date of Patent: Nov. 19, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Chuan He, Suzhou (CN); Xiaoqing Pu, Suzhou (CN); Ronghui Hao, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/617,935

(22) PCT Filed: Nov. 9, 2021

(86) PCT No.: PCT/CN2021/129622
§ 371 (c)(1),
(2) Date: Dec. 10, 2021

(87) PCT Pub. No.: WO2023/082058
PCT Pub. Date: May 19, 2023

(65) Prior Publication Data
US 2024/0162298 A1 May 16, 2024

(51) Int. Cl.
*H01L 29/20* (2006.01)
*H01L 29/66* (2006.01)
*H01L 29/778* (2006.01)

(52) U.S. Cl.
CPC .... *H01L 29/2003* (2013.01); *H01L 29/66462* (2013.01); *H01L 29/7787* (2013.01)

(58) Field of Classification Search
None
See application file for complete search history.

(56) References Cited

U.S. PATENT DOCUMENTS 8,697,581 B2 4/2014 Beach et al.
2012/0267642 A1 10/2012 Jeon et al.
(Continued)

FOREIGN PATENT DOCUMENTS

CN 110392929 A 10/2019
CN 105405877 B 11/2019
(Continued)

OTHER PUBLICATIONS

International Search Report and Written Opinion of corresponding PCT application No. PCT/CN2021/129622 mailed on Aug. 8, 2022.

*Primary Examiner* — Michelle Mandala
(74) *Attorney, Agent, or Firm* — Li & Cai Intellectual Property (USA) Office

(57) ABSTRACT

A nitride-based semiconductor device includes a first nitride-based semiconductor layer, a second nitride-based semiconductor layer, a source electrode, a drain electrode, a gate electrode, and a third nitride-based semiconductor layer. The first nitride-based semiconductor layer has at least one trench. The second nitride-based semiconductor layer is disposed on the first nitride-based semiconductor layer and spaced apart from the trench. The source electrode and the drain electrode are disposed above the second nitride-based semiconductor layer. The gate electrode is disposed above the second nitride-based semiconductor layer and between the source and drain electrodes, so as to at least define a drift region between the gate electrode and the drain electrode and overlaps with the trench. The third nitride-based semiconductor layer is at least disposed in the trench and extends upward from the trench to make contact with the second nitride-based semiconductor layer.

19 Claims, 9 Drawing Sheets

(56) References Cited

U.S. PATENT DOCUMENTS

| | | | |
|---|---|---|---|
| 2014/0084300 A1 | 3/2014 | Okamoto et al. | |
| 2014/0097468 A1* | 4/2014 | Okita | H01L 29/42316 257/192 |
| 2017/0103898 A1 | 4/2017 | Inoue et al. | |
| 2020/0105917 A1* | 4/2020 | Okita | H01L 29/205 |
| 2021/0376136 A1* | 12/2021 | Akutsu | H01L 21/30621 |

FOREIGN PATENT DOCUMENTS

| | | |
|---|---|---|
| CN | 110707154 A | 1/2020 |
| CN | 112331719 A | 2/2021 |
| CN | 112885891 A | 6/2021 |
| KR | 20140141126 A | 12/2014 |

* cited by examiner

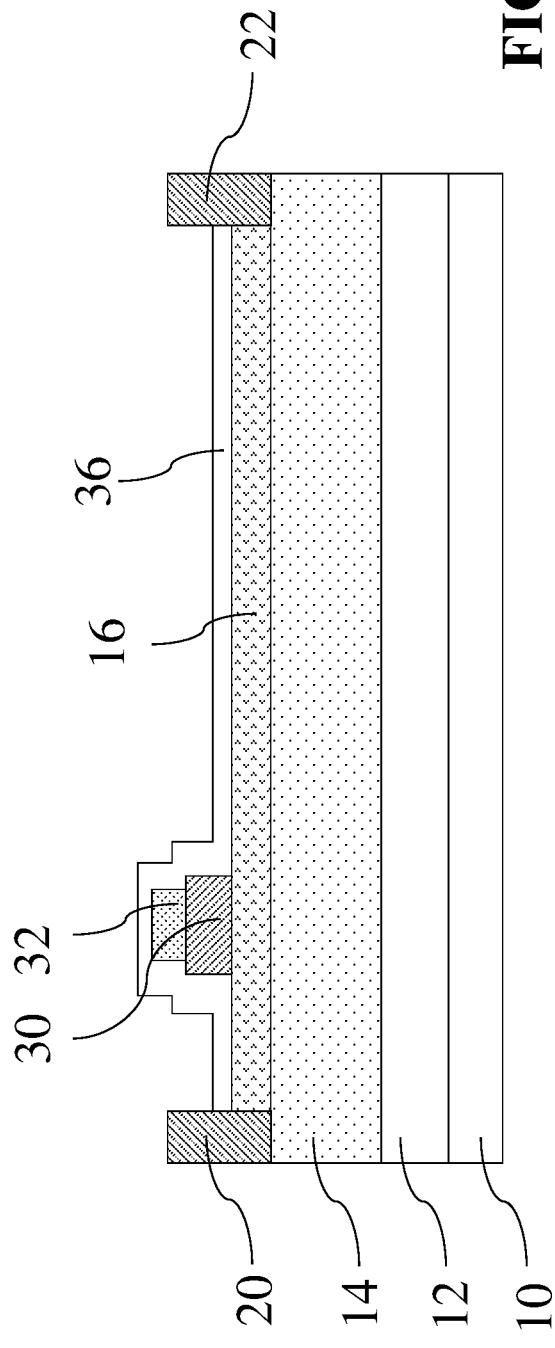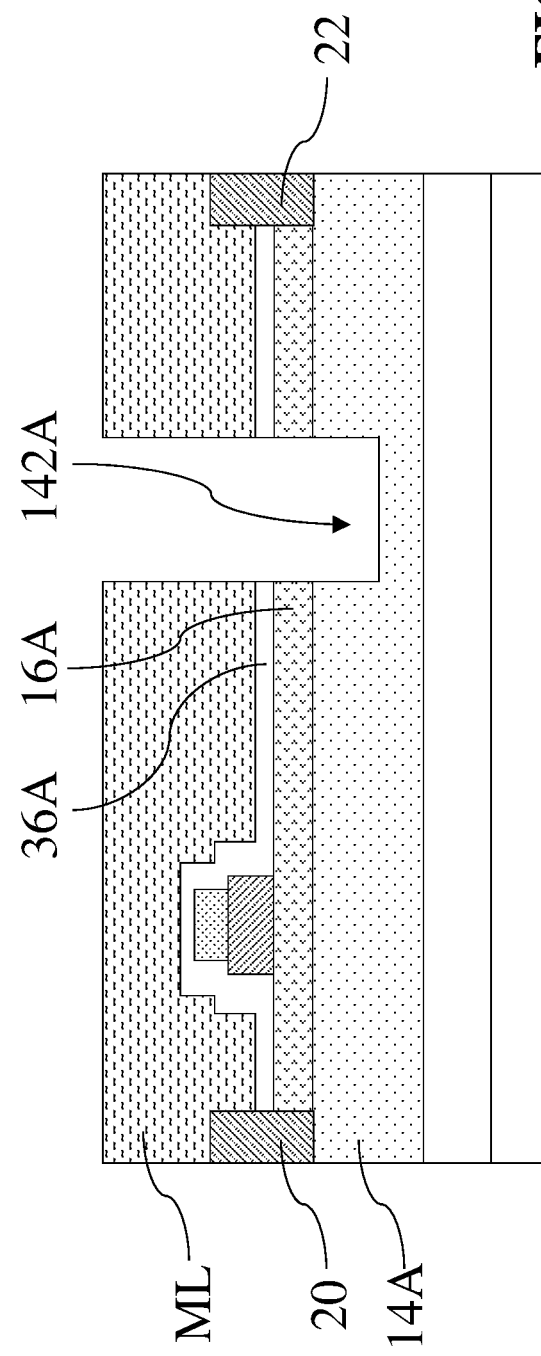

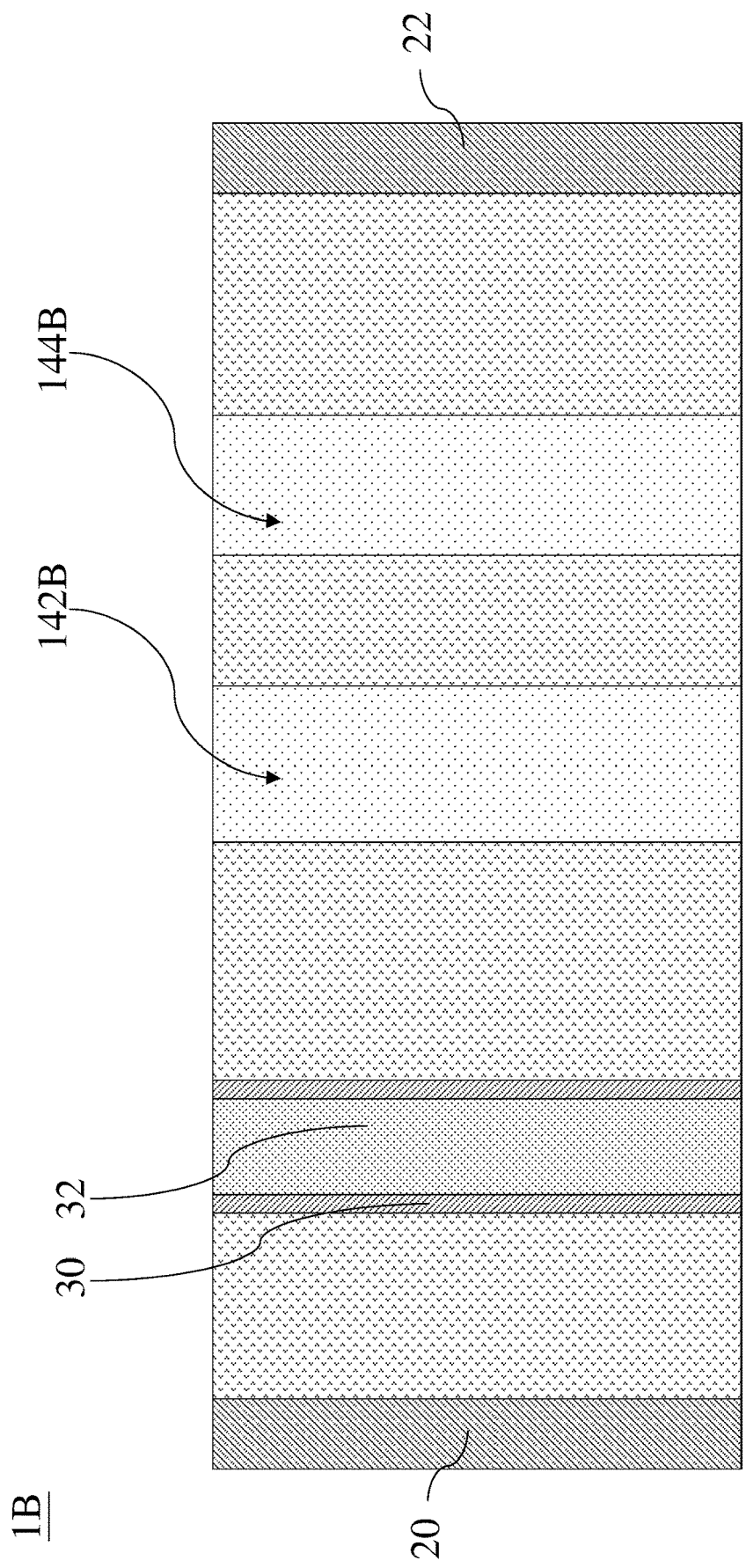

NITRIDE-BASED SEMICONDUCTOR DEVICE AND METHOD FOR MANUFACTURING THE SAME

FIELD OF THE INVENTION

The present invention generally relates to a nitride-based semiconductor device. More specifically, the present invention relates to a nitride-based semiconductor device having a channel layer provided with at least one trench.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

With respect to the nitride-based devices, how to reduce/alleviate the breakdown phenomenon induced by a strong peak electric field near a drain edge of the gate electrode has become an important issue. When the device is operated under a high voltage condition, the breakdown phenomenon easily occurs, thereby deteriorating the electrical properties and the reliability. Accordingly, there is a need to develop a device having good electrical properties.

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate electrode, and a third nitride-based semiconductor layer. The first nitride-based semiconductor layer has at least one trench. The second nitride-based semiconductor layer is disposed on the first nitride-based semiconductor layer and spaced apart from the trench. The second nitride-based semiconductor layer has a bandgap higher than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes, so as to at least define a drift region between the gate electrode and the drain electrode and overlapping with the trench. The third nitride-based semiconductor layer is at least disposed in the trench and extends upward from the trench to make contact with the second nitride-based semiconductor layer. The third nitride-based semiconductor layer has a bandgap higher than the bandgap of the first nitride-based semiconductor layer.

In accordance with one aspect of the present disclosure, method for manufacturing a semiconductor device is provided. The method includes steps as follows. A first nitride-based semiconductor layer is formed over a substrate. A second nitride-based semiconductor layer is formed on the first nitride-based semiconductor layer. A source electrode, a drain electrode, and a gate electrode are formed over the second nitride-based semiconductor layer. A dielectric layer is formed over the second nitride-based semiconductor layer to at least cover the gate electrode. Portions of the dielectric layer, the first nitride-based semiconductor layer, and the second nitride-based semiconductor layer are removed, so as to form at least one trench on the second nitride-based semiconductor layer. A third nitride-based semiconductor layer is formed at least within the trench and connecting with the second nitride-based semiconductor layer.

In accordance with one aspect of the present disclosure, a nitride-based semiconductor device is provided. A nitride-based semiconductor device includes a first nitride-based semiconductor layer, a second nitride-based semiconductor layer, a source electrode, a drain electrode, a gate electrode, a dielectric layer, and a third nitride-based semiconductor layer. The first nitride-based semiconductor layer has at least one trench. The second nitride-based semiconductor layer is disposed on the first nitride-based semiconductor layer and spaced apart from the trench. The second nitride-based semiconductor layer has a bandgap higher than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes, so as to at least define a drift region between the gate electrode and the drain electrode and overlapping with the trench. The dielectric layer disposed over the second nitride-based semiconductor layer and have portions separated from each other by the trench. The third nitride-based semiconductor layer is at least disposed in the trench between the portions of the dielectric layer. The third nitride-based semiconductor layer directly connects to the second nitride-based semiconductor layer to form a barrier layer on the first nitride-based semiconductor layer.

By applying the above configuration, the nitride-based semiconductor layer, which serves as a channel layer, is provided with at least one trench, such that at least one zone of the 2DEG region therein can distribute along a depth direction of the trench. Therefore, the length of the overall 2DEG region increases without enlarging the dimension of the device. By increasing the length of the overall 2DEG region, the withstand voltage ability of the semiconductor device is improved.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, and FIG. 2C show different stages of a method for manufacturing a nitride-based semiconductor device according to some embodiments of the present disclosure;

FIG. 3B is a top view of a semiconductor device according to some embodiments of the present disclosure;

DETAILED DESCRIPTION

Figure 1A:
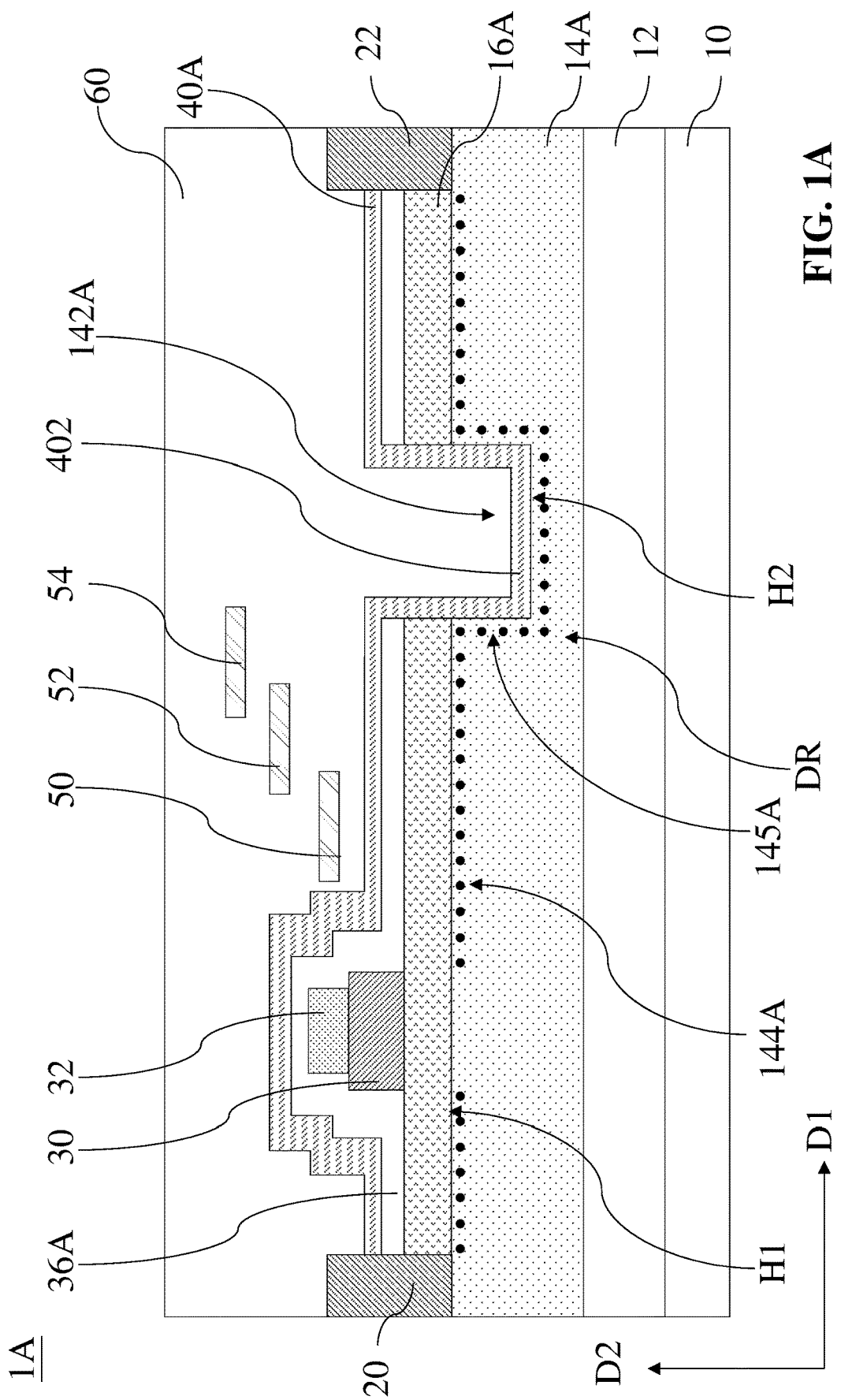
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical cross-sectional view of a semiconductor device 1A according to some embodiments of the present disclosure. The directions D1 and D2 are labeled in the FIG. 1A, in which the direction D1 is different than the direction D2. In some embodiments, the direction D1 is perpendicular to the direction D2. For example, the direction D1 can be a horizontal direction, and the direction D2 can be a vertical direction.

The semiconductor device 1A includes a substrate 10, a buffer layer 12, nitride-based semiconductor layers 14A and 16A, electrodes 20 and 22, a doped nitride-based semiconductor layer 30, a gate electrode 32, a dielectric layer 36A, a nitride-based semiconductor layer 40A, field plates 50, 52 and 54, and a passivation layer 60.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed between the substrate 10 and the nitride-based semiconductor layer 14A. The buffer layer 12 can be configured to reduce lattice and thermal mismatches between the substrate 10 and the nitride-based semiconductor layer 14A, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and a buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14A can be disposed on/over/above the buffer layer 12. The nitride-based semiconductor layer 16A can be disposed on/over/above the nitride-based semiconductor layer 14A. The exemplary materials of the nitride-based semiconductor layer 14A can include, for example but are not limited to, nitrides or group III-V compounds, such as GaN, AlN, InN, $In_xAl_yGa_{(1-x-y)}N$ where $x+y\leq 1$, $Al_xGa_{(1-x)}N$ where $x\leq 1$. The exemplary materials of the nitride-based semiconductor layer 16A can include, for example but are not limited to, nitrides or group III-V compounds, such as GaN, AlN, InN, $In_xAl_yGa_{(1-x-y)}N$ where $x+y\leq 1$, $Al_yGa_{(1-y)}N$ where $y\leq 1$.

Due to polarization effect of the nitride-based semiconductor layers 14A and 16A, a two-dimensional electron gas (2DEG) region 144A can be generated. The detailed generation of the 2DEG region 144A in the semiconductor device 1A will be described later.

The electrodes 20 and 22 can be disposed on/over/above the nitride-based semiconductor layer 14A. The electrodes 20 and 22 penetrate the nitride-based semiconductor layer 16A, so as to make contact with the nitride-based semiconductor layer 14A. In some embodiments, the electrode 20 can serve as a source electrode. In some embodiments, the electrode 20 can serve as a drain electrode. In some embodiments, the electrode 22 can serve as a source electrode. In some embodiments, the electrode 22 can serve as a drain electrode. The role of the electrodes 20 and 22 depends on the device design.

The doped nitride-based semiconductor layer 30 can be disposed on/over/above the nitride-based semiconductor layer 16A. The doped nitride-based semiconductor layer 30 can be in contact with the nitride-based semiconductor layer 16A. The doped nitride-based semiconductor layer 30 can be p-type doped. The doped nitride-based semiconductor layer 30 can be a p-type doped III-V compound semiconductor layer. The exemplary materials of the p-type doped nitride-based semiconductor layer 30 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg.

The gate electrode 32 can be disposed on/over/above the doped nitride-based semiconductor layer 30 and the nitride-based semiconductor layer 16A. The gate electrode 32 and the electrode 22 can collectively define a drift region DR therebetween.

A width of the doped nitride-based semiconductor layer 30 can be greater than that of the gate electrode 32. In some embodiments, a width of the doped nitride-based semiconductor layer 30 can be substantially the same as a width of the gate electrode 30. The profiles of the doped nitride-based semiconductor layer 30 and the gate electrode 32 are the same, for example, both of them are rectangular profiles. In some embodiments, the profiles of the doped nitride-based semiconductor layer 30 and the gate electrode 32 can be different from each other. For example, the profile of the doped nitride-based semiconductor layer 30 can be a trapezoid profile, and the profile of the nitride-based semiconductor layer 32 can be a rectangular profile.

The electrode 20 is closer to the gate electrode 32 than the electrode 22. That is, the electrodes 20 and 22 can be arranged as being asymmetrical about the gate electrode 32. In some embodiments, the electrodes 20 and 22 can be arranged as being symmetrical about the gate electrodes 32. The arrangement depends on different electrical property requirements.

The exemplary materials of the gate electrode 32 may include metals or metal compounds. The gate electrode 32 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Cu, Al, metal alloys or compounds thereof, or other metallic compounds.

The dielectric layer 36A can be disposed on/over/above the nitride-based semiconductor layer 16A. The dielectric layer 36A covers the gate electrode 32 and the doped nitride-based semiconductor layer 30, so as to form a protruding portion. The material of the dielectric layer 36A can include, for example but are not limited to, dielectric materials. For example, the dielectric layer 36A can include, for example but are not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the dielectric layer 36A can be a multi-layered structure, such as a composite dielectric layer of $Al_2O_3$/SiN, $Al_2O_3$/$SiO_2$, AlN/SiN, AlN/$SiO_2$, or combinations thereof.

The nitride-based semiconductor layer 40A can be disposed on/over/above the dielectric layer 36A. The nitride-based semiconductor layer 40A covers a top surface of the dielectric layer 36A. The nitride-based semiconductor layers 16A and 40A are directly stacked on the nitride-based semiconductor layer 14A.

The nitride-based semiconductor layers 16A and 40A can be in contact with the nitride-based semiconductor layer 14A. The exemplary materials of the nitride-based semiconductor layer 40A can include, for example but are not limited to, nitrides or group III-V compounds, such as GaN, AlN, InN, $In_xAl_yGa_{(1-x-y)}N$ where $x+y \leq 1$, $Al_aGa_{(1-a)}N$ where $a \leq 1$. Due to polarization effect of the nitride-based semiconductor layers 14A and 40A, a 2DEG region 145A can be generated. The detailed generation of the 2DEG region 145A in the semiconductor device 1A will be described later.

In the embodiments of the present disclosure, the nitride-based semiconductor layer 14A is formed to have at least one trench 142A. The trench 142A has a depth along the direction D2. The trench 142A is located between the gate electrode 32 and the electrode 22. The trench 142A overlaps with the drift region DR.

Figure 1B:
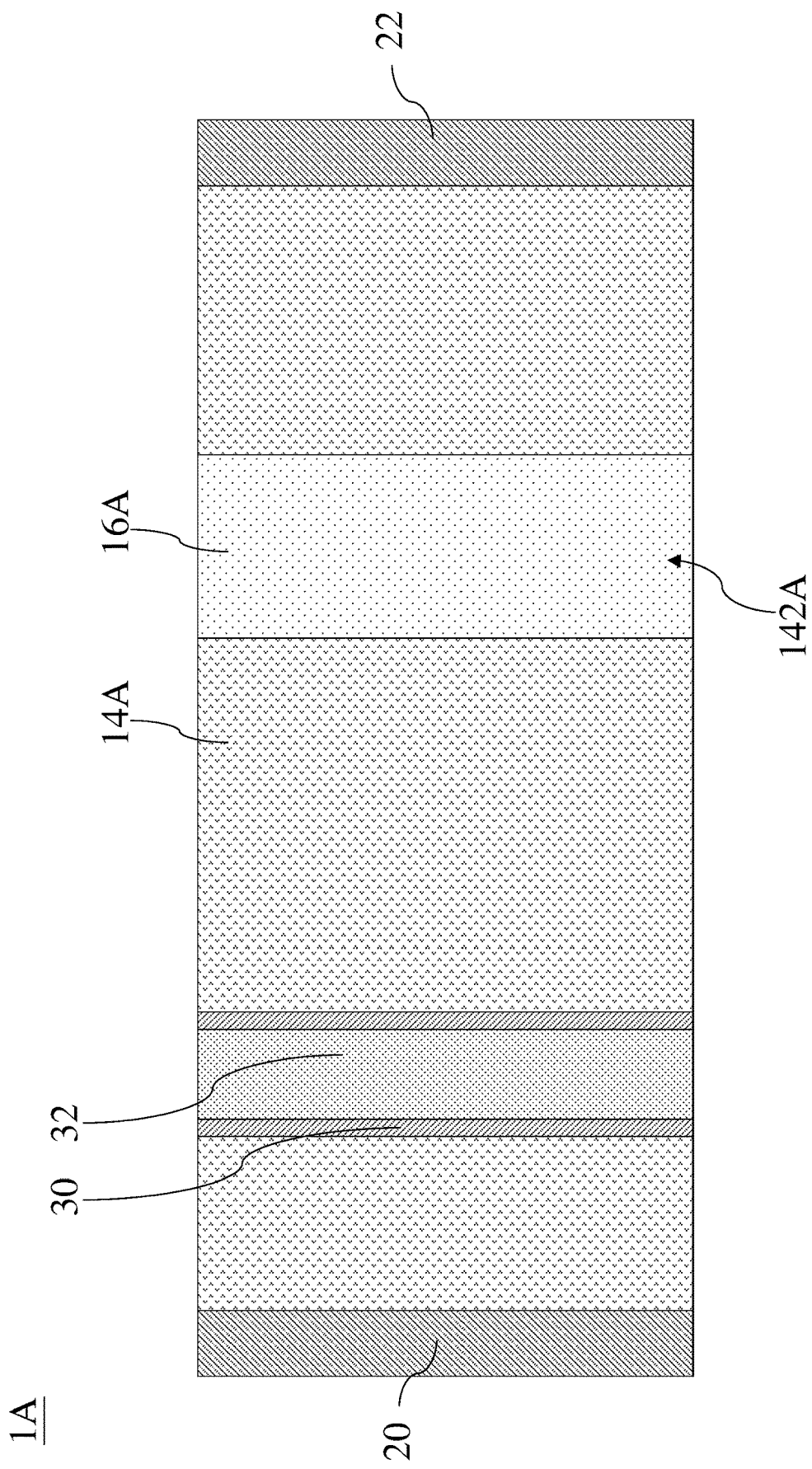
FIG. 1B is a top view of the semiconductor device in the FIG. 1A.

The trench 142A can be formed as a strip across the nitride-based semiconductor layer 14A. To illustrate, FIG. 1B is a top view of a semiconductor device 1A according to some embodiments of the present disclosure. In the exemplary illustration of FIG. 1B, the electrodes 20 and 22, the doped nitride-based semiconductor layer 30, and the gate electrode 32 extend along a vertical direction of FIG. 1B. The trench 142A extends along an extending direction the same as (i.e. being parallel with) the vertical direction.

Referring back to FIG. 1A, by etching the nitride-based semiconductor layer 14A (e.g., channel layer) to form at least one trench 142A, the distribution of the 2DEG region in the semiconductor device 1A can be redistributed/rearranged. The detailed configuration of the 2DEG region will be fully described as follows.

The exemplary materials of the nitride-based semiconductor layers 14A, 16A, and 40A are selected such that bandgaps (i.e., forbidden band width) of the nitride-based semiconductor layers 16A and 40A are greater than a bandgap of the nitride-based semiconductor layer 14A, which causes electron affinities thereof different from each other. A heterojunction H1 is formed between the nitride-based semiconductor layers 14A and 16A. A heterojunction H2 is formed between the nitride-based semiconductor layers 14A and 40A. The heterojunction H2 is in the trench 142A. The heterojunction H2 is beneath the trench 142A.

For example, when the nitride-based semiconductor layer 14A is an undoped GaN layer having a bandgap of approximately 3.4 eV, each of the nitride-based semiconductor layers 16A and 40A can be selected as an AlGaN layer having a bandgap of approximately 4.0 eV. As such, the nitride-based semiconductor layer 14A can serve as a channel layer, and the nitride-based semiconductor layers 16A and 40A can collectively serve as a barrier layer.

In this regard, since the nitride-based semiconductor layers 16A and 40A are connected to each other, they can collectively serve as a barrier layer coving the channel layer. A triangular well potential is generated at a bonded interface between the channel and barrier layers, so that electrons accumulate in the triangular well, thereby generating the 2DEG regions 144A and 145A adjacent to the heterojunctions H1 and H2, respectively. Accordingly, the semiconductor device 1A is available to include at least one GaN-based high-electron-mobility transistor (HEMT).

In the exemplary illustration of FIG. 1A, since the nitride-based semiconductor layer 16A is disposed on a plane surface of the nitride-based semiconductor layer 14A, the heterojunction H1 therebetween can extend along the direction D1. Therefore, the 2DEG region 144A adjacent to the heterojunction H1 can distribute along the direction D1.

At least a portion 402 of the nitride-based semiconductor layer 40A can be disposed in/within the trench 142A, such that the portion 402 can be conformal with the profile of the trench 142A. Hence, the portion 402 can have a U-shaped profile. Accordingly, the heterojunction H2 between the nitride-based semiconductor layers 14A and 40A can be U-shaped. The nitride-based semiconductor layers 14A and 40A collectively form the 2DEG region 145A adjacent to at least a part of the heterojunction H2. The 2DEG region 145A can distribute along the direction D1 and the direction D2. The 2DEG region 145A can distribute as being U-shaped.

By forming at least one trench 142A in the nitride-based semiconductor layer 14A (e.g., channel layer), the geometry of the overall 2DEG region in the nitride-based semiconductor layer 14A can be altered by the configuration of the trench 142A. Specifically, the 2DEG region 144A and the 2DEG region 145A are connected to each other, so carriers can be still transported from the electrode 20 to the electrode 22 via the combination of the 2DEG region 144A and the 2DEG region 145A. Because the 2DEG region 145A at least extends along the direction D2, a ratio of a path length of the combination of the 2DEG region 144A and the 2DEG region 145A to the width of the nitride-based semiconductor layer 14A is increased. Therefore, the length of the overall 2DEG region (i.e., the combination of the 2DEG region 144A and 145A) increases, so the withstand voltage of the semiconductor device 1A can be improved without specifically enlarging the dimension of the nitride-based semiconductor layer 14.

As considered a comparative semiconductor device having a channel layer with a wholly plane surface (i.e., without the trench 142A), a barrier layer would be disposed on the plane surface of the channel layer, so an absolutely horizontal heterojunction is formed therebetween. During the operation, a high voltage may be applied to a drain electrode, so the withstand voltage issue is raised. With such that configuration, once the withstand voltage ability needs to be improved, one of the manners is to increase a horizontal distance between a gate electrode and a drain electrode (i.e., $L_{gd}$); however, such a design would increase the overall volume of the device.

As compared to the comparative semiconductor device, the overall 2DEG region of the semiconductor device 1A can be distributed in two directions, including the directions D1 and D2, such that the equivalent length of the overall 2DEG region increases. Therefore, the semiconductor device 1A can have the improved withstand voltage ability with the dimension kept.

In the exemplary illustration of FIG. 1A, the semiconductor device 1A is an enhancement mode device, which is in a normally-off state when the gate electrode 32 is at approximately zero bias. Specifically, the doped nitride-based semiconductor layer 30 may create at least one p-n junction with the nitride-based semiconductor layer 14A to deplete a zone of the 2DEG region 144A, such that the zone of the 2DEG region 144A corresponding to a region A below the corresponding the gate electrode 32 has different characteristics (e.g., different electron concentrations) than the rest of the 2DEG region and thus is blocked.

Due to such mechanism, the semiconductor device 1A has a normally-off characteristic. In other words, when no voltage is applied to the gate electrode 32 or a voltage applied to the gate electrode 32 is less than a threshold voltage (i.e., a minimum voltage required to form an inversion layer below the gate electrode 32), the zone of the 2DEG region 144A below the gate electrode 32 is kept blocked, and thus no current flows therethrough.

When the gate electrode 32 is applied to a voltage greater than a threshold voltage, the electrons would be attracted to the heterojunction beneath the gate electrode 32, thereby making the 2DEG region 144A continuous between the electrodes 20 and 22. The gate electrode 32 can control the conductivity status of the semiconductor device 1A, and therefore the gate electrode 32 can be referred to as a control electrode.

Since the trench 142A is vertically spaced apart from the gate electrode 32, the conductivity of the drift region DR near the trench 142A is free from the control of the gate electrode 32. In this regard, the conductivity of the drift region DR depends on the continuity of the combination of the 2DEG regions 144A and 145A. Therefore, there is a need to tune the continuity of the combination of the 2DEG regions 144A and 145A near the trench 142A for avoiding open circuits issue.

It should be noted that the carrier density in a 2DEG region is positive related to polarization effect between a channel layer and a barrier layer. An aluminum (Al) content and a thickness of a barrier layer can determine an extent of the polarization effect.

The Al content or thickness of the nitride-based semiconductor layer 40A can be tailored, so as to achieve a good connection between the 2DEG regions 144A and 145A. Specifically, the nitride-based semiconductor layers 16A and 40A (e.g., barrier layers) can have the same group III element. For example, each of the nitride-based semiconductor layers 16A and 40 can be selected as an AlGaN layer, so both of them at least have the same group III element, such as aluminum. The parameters such as concentration or thickness of the nitride-based semiconductor layers 16A and 40A can be different. In some embodiments, a concentration of the group III element contained in the nitride-based semiconductor layer 16A can be less than a concentration of the group III element contained in the nitride-based semiconductor layer 40A. In some embodiments, a thickness of the nitride-based semiconductor layer 16A can be greater than a thickness of the nitride-based semiconductor layer 40A.

As such, the concentration of the 2DEG region 145A can be consistent with that of the 2DEG region 144A, and the continuity of the combination of the 2DEG regions 144A and 145A near the trench 142A can be achieved. Such a design can balance the overall thickness and the electric properties of the semiconductor device 1A.

Moreover, the nitride-based semiconductor layer 40A extends upward from the trench 142A to a position higher than the nitride-based semiconductor layer 16A, the dielectric layer 36A, and the gate electrode 32. The nitride-based semiconductor layer 40 extends to cover side surfaces of the nitride-based semiconductor layer 16A and the dielectric layer 36A which abut against each other. As such, the bonding area of the doped nitride-based semiconductor layer 40A to other layers increases, so it can avoid peeling of the doped nitride-based semiconductor layer 40A, keeping the continuity of the combination of the 2DEG regions 144A and 145A well.

In another view, as the nitride-based semiconductor layer 40A is formed to extends to cover side surfaces of the nitride-based semiconductor layer 16A and the dielectric layer 36A and to abut against the electrodes 20 and 22, the formation of the nitride-based semiconductor layer 40 can be performed by using the same reticle as other layers.

In some embodiments, the doped nitride-based semiconductor layer 30 can be omitted, such that the semiconductor device 1A is a depletion-mode device, which means the semiconductor device 1A in a normally-on state at zero gate-source voltage.

Furthermore, for a HEMT device, distribution/location of a 2DEG can determine a surface electric field distribution in the device. With the trench 142A, the 2DEG region 145A can further extend the direction D2 (i.e., the vertical direction) as well, so the surface electric field distribution in the semiconductor device 1A can be modulated. In some embodiments, at least a part of the trench 142A can have an inclined profile. For example, in some embodiments, the trench 142A can have a V-shaped or a W-shaped profile. The afore-mentioned profiles can have inclined depth directions, which provides the 2DEG regions with more degrees of freedom for the electric field distribution, thereby achieving a more uniform electric field. The space utilization of the electric field distribution can be further enhanced.

The field plates 50, 52 and 54 are disposed on/over/above the nitride-based semiconductor layer 40A. The configuration of the field plates 50, 52 and 54 can further split the electric field into more peaks so as to achieve a more uniform electric field distribution. The exemplary materials of the field plates 50, 52, 54 can include, for example but are not limited to, conductive materials, such as Ti, Ta, TiN, TaN, or combinations thereof. In some embodiments, other conductive materials such as Al, Cu doped Si, and alloys including these materials may also be used.

The passivation layer 60 can be disposed on/over/above the electrodes 20 and 22, and the dielectric layer 36A. The field plates 50, 52 and 54 are embedded/buried in the passivation layer 60. The passivation layer 60 has a protruding portion within the trench 142A. The trench 142A is fully filled by the passivation layer 60 and the nitride-based semiconductor layer 40A. The material of the passivation layer 60 can include, for example but is not limited to, dielectric materials. The passivation layer 60 can serve as a planarization layer which has a level top surface to support other layers/elements. In some embodiments, the passivation layer 60 can be formed as being thicker, and a planarization process, such as a chemical mechanical polish (CMP) process, is performed on the passivation layer 60 to remove the excess portions, thereby forming a level top surface. The exemplary materials of the passivation layer 60 can be identical to or similar to that of the dielectric layer 36A.

Figure 2C:
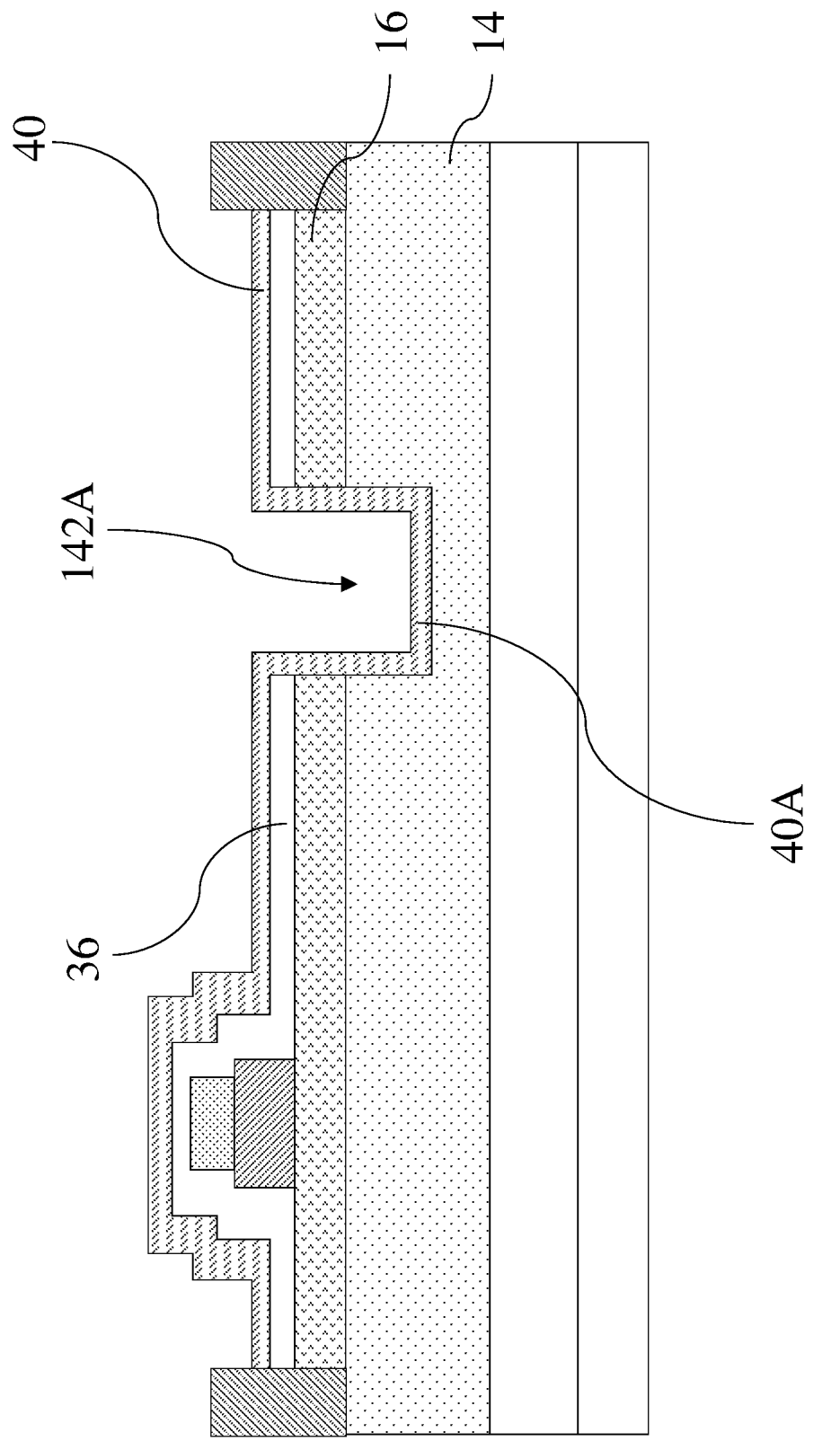

Different stages of a method for manufacturing the semiconductor device 1A are shown in FIG. 2A, FIG. 2B, and FIG. 2C, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 2A, a buffer layer 12 can be formed on/over/above a substrate 10 by using the above-mentioned deposition techniques. A nitride-based semiconductor layer 12 can be formed on/over/above a nitride-based semiconductor layer 14 by using the above-mentioned deposition techniques. An etching process is performed on the nitride-based semiconductor layer 16A, so as to expose the nitride-based semiconductor layer 14. Electrodes 20 and 22 can be formed on/over/above the nitride-based semiconductor layer 14, so as to be in contact with the nitride-based semiconductor layer 14. A doped nitride-based semiconductor layer 30 and a gate electrode 32 can be formed in sequence on the nitride-based semiconductor layer 16A. A dielectric layer 36 can be formed over the nitride-based semiconductor layer 16A to at least cover the doped nitride-based semiconductor layer 30 and the gate electrode 32. The formation of the electrodes 20 and 22, the doped nitride-based semiconductor layer 30, and the gate electrode 32 includes deposition techniques and a patterning process. In some embodiments, the patterning process can include photolithography, exposure and development, etching, other suitable processes, or combinations thereof.

Referring to FIG. 2B, a mask layer ML can be formed on the electrodes 20 and 22, and the dielectric layer 36. An etching process is performed/applied on the dielectric layer 36, the nitride-based semiconductor layers 14 and 16 by using the mask layer ML, and thus portions of the dielectric layer 36, the nitride-based semiconductor layers 14 and 16A are removed. After the etching process, the dielectric layer 36A, the nitride-based semiconductor layers 14A and 16A are formed. At least one trench 142A is formed on the nitride-based semiconductor layer 14A.

Referring to FIG. 2C, the mask layer ML is removed. A nitride-based semiconductor layer 40A can be formed on/over/above the dielectric layer 36A, such that at least a portion 402 of the nitride-based semiconductor layer 40A is formed within the trench 142A. The portion 402 of the nitride-based semiconductor layer 40A connects with the nitride-based semiconductor layers 14A, 16A and the dielectric layer 36A. The nitride-based semiconductor layer 40A can be formed to extend laterally on the dielectric layer 36A. The nitride-based semiconductor layer 40A is formed to directly stack on the nitride-based semiconductor layer 16A. Thereafter, field plates 50, 52 and 54, and the passivation layer 60 are formed on the resultant structure, so as to obtain the structure as shown in FIG. 1A.

Figure 3A:
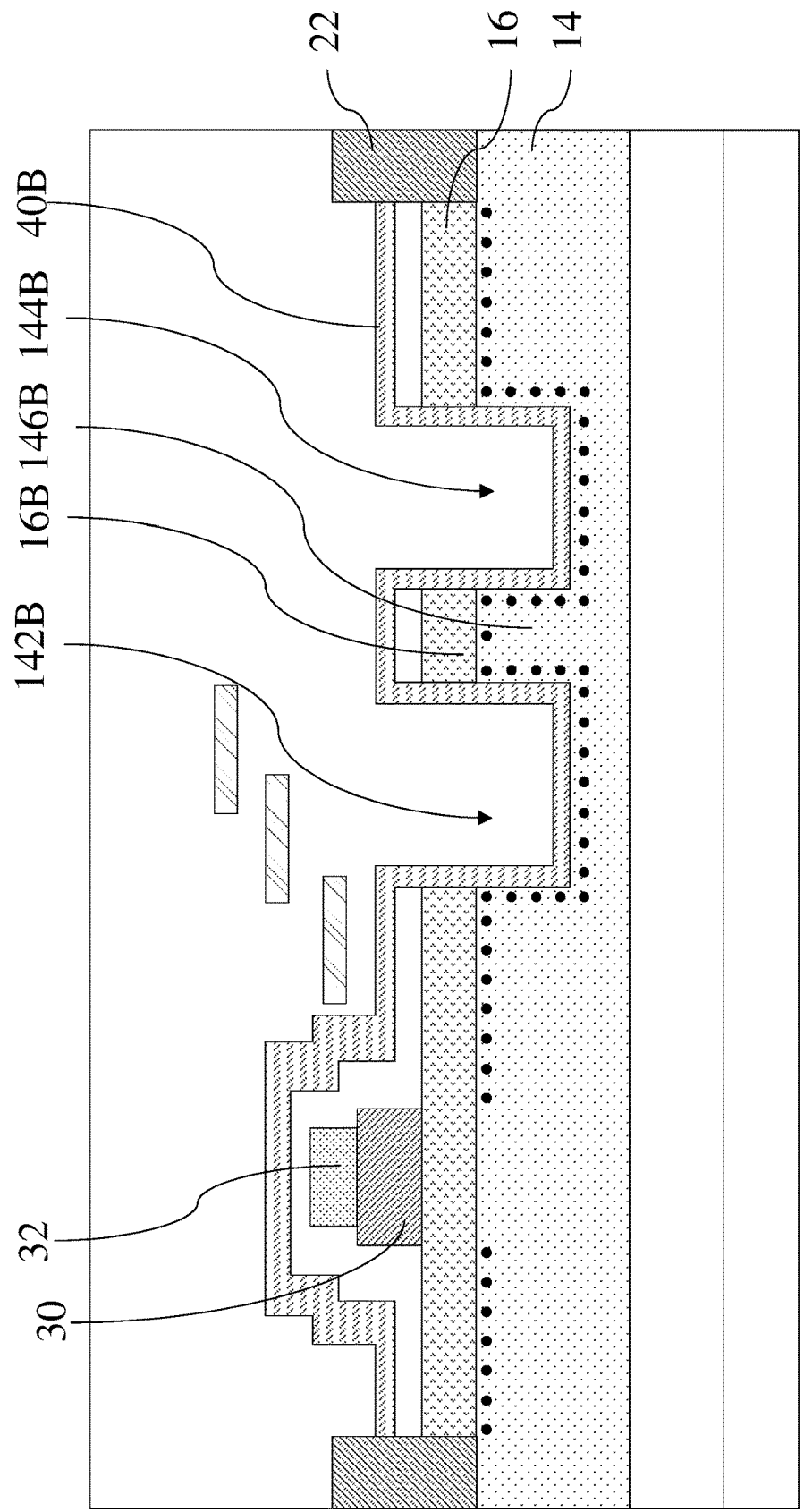
FIG. 3A is a vertical cross-sectional view of a semiconductor device according to some embodiments of the present disclosure.

FIG. 3A is a vertical cross-sectional view of a semiconductor device 1B according to some embodiments of the present disclosure. FIG. 3B is a top view of the semiconductor device in the FIG. 3A. The semiconductor device 1B is similar to the semiconductor device 1A as described and illustrated with reference to FIG. 1A and FIG. 1B, except that the nitride-based semiconductor layers 14A and 16A are replaced by nitride-based semiconductor layers 14B and 16B.

The nitride-based semiconductor layer 14B has two trenches 142B and 144B between the gate electrode 32 and the electrode 22. The trenches 142B and 144B accommodate the nitride-based semiconductor layer 40B. In the top view of the semiconductor device 1B (see FIG. 3B), the extending direction of the trenches 142B and 144B is the same as that of the electrodes 20, 22, the doped nitride-based semiconductor layer 30, and the gate electrode 32.

The nitride-based semiconductor layer 14B has a portion 146B between the two trenches 142B and 144B. The nitride-based semiconductor layer 16B has an island 162B on the portion 146B of the nitride-based semiconductor layer 14B. Such a configuration with multi trenches can further increase the length of the overall 2DEG region of the semiconductor device 1B.

In the exemplary illustration of FIG. 3A, the trenches 142B and 144B can be similar profiles, for example, U-shaped profiles. In some embodiments, the profile of the trench 142B can be different from that of the trench 144B. For instance, in some embodiments, the profile of the trench 142B can be U-shaped, and the profile of the trench 144B can be V-shaped.

During the manufacturing stage of the semiconductor device 1B, the etching process is performed such that two or more trenches 142B and 144B are formed on the nitride-based semiconductor layer 14B. For instance, the mask layer applied to the etching process can have two or more openings, corresponding to the positions of the trenches 142B and 144B. In other embodiments, the nitride-based semiconductor layer 14B has more than two trenches between the gate electrode 32 and the electrode 22.

Figure 4:
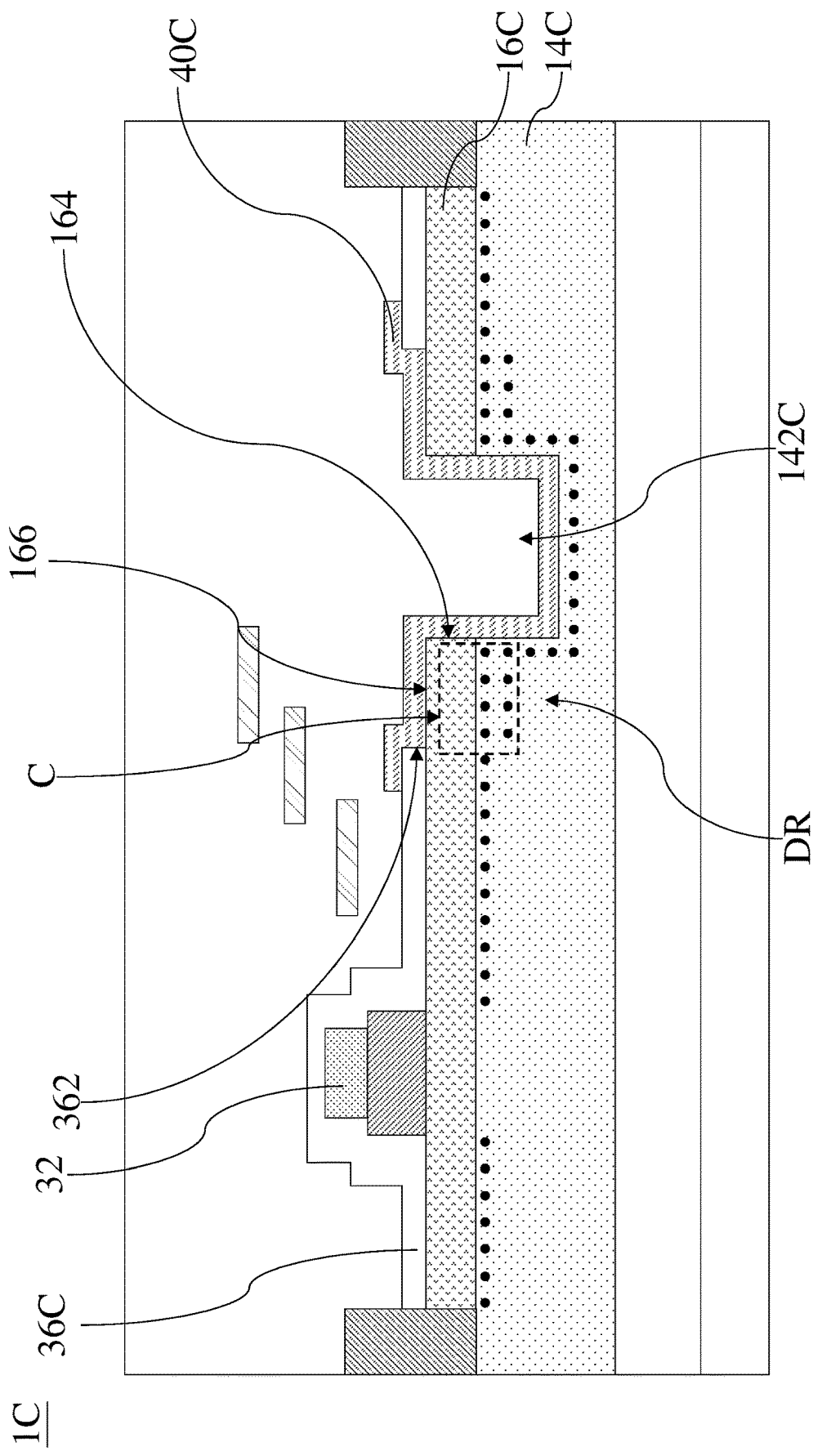
FIG. 4 is a vertical cross-sectional view of a semiconductor device according to some embodiments of the present disclosure.

FIG. 4 is a vertical cross-sectional view of a semiconductor device 1C according to some embodiments of the present disclosure. The semiconductor device 1C is similar to the semiconductor device 1A as described and illustrated with reference to FIG. 1A, except that the nitride-based semiconductor layer 40A and the dielectric layer 36A are replaced by a nitride-based semiconductor layer 40C and a dielectric layer 36C.

The dielectric layer 36C has a side surface 362 spaced apart from a side surface 164 of the nitride-based semiconductor layer 16C by a top surface 166 of the nitride-based semiconductor layer 16. The nitride-based semiconductor layer 40C extends to cover the side surface 164 and the top surface 166 of the nitride-based semiconductor layer 16 and the side surface 362 of the dielectric layer 36C.

The nitride-based semiconductor layer 40C is vertically spaced apart from the gate electrode 32. The nitride-based semiconductor layers 16C and 40C can be directly stacked on the nitride-based semiconductor layer 14C in a region C and adjacent to the trench 142C. That is to say, the nitride-based semiconductor layer 40C directly connects to the nitride-based semiconductor layer 16C to collectively form a thicker barrier layer on the nitride-based semiconductor layer 14C, such that the concentration of the 2DEG region in the region C can be enhanced. The thicker barrier formed by the nitride-based semiconductor layers 16C and 40C entirely covers the drift region DR. The present embodiment is to provide a manner to tune the concentration of the 2DEG region within the region C, so the semiconductor device 1C can be applied to more requirements.

Different stages of a method for manufacturing the semiconductor device 1C are shown in FIG. 5A, FIG. 5B, FIG. 5C and FIG. 5D, as described below.

Figure 5A:
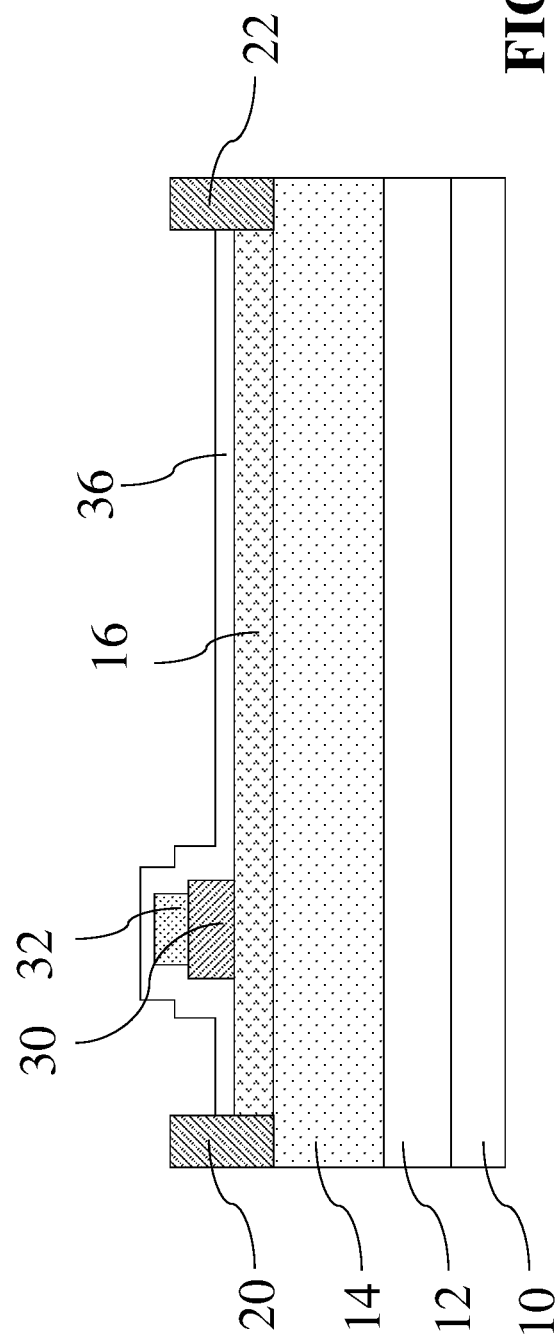
FIG. 5A, FIG. 5B, FIG. 5C, and FIG. 5D show different stages of a method for manufacturing a nitride-based semiconductor device according to some embodiments of the present disclosure.

Referring to FIG. 5A, a buffer layer 12 can be formed on/over/above a substrate 10 by using the above-mentioned deposition techniques. A nitride-based semiconductor layer 12 can be formed on/over/above a nitride-based semiconductor layer 14 by using the above-mentioned deposition techniques. An etching process is performed on the nitride-based semiconductor layer 16, so as to expose at least a part of the top surface of the nitride-based semiconductor layer 14. Electrodes 20 and 22 can be formed on/over/above the nitride-based semiconductor layer 14, such that the electrodes 20 and 22 can be in contact with the nitride-based semiconductor layer 14. A doped nitride-based semiconductor layer 30 and a gate electrode 32 can be formed in sequence on the nitride-based semiconductor layer 16. A dielectric layer 36 can be formed over the nitride-based semiconductor layer 16 to at least cover the doped nitride-based semiconductor layer 30 and the gate electrode 32. The formation of the electrodes 20 and 22, the doped nitride-based semiconductor layer 30, and the gate electrode 32 includes deposition techniques and a patterning process. In some embodiments, the patterning process can include photolithography, exposure and development, etching, other suitable processes, or combinations thereof.

Figure 5B:
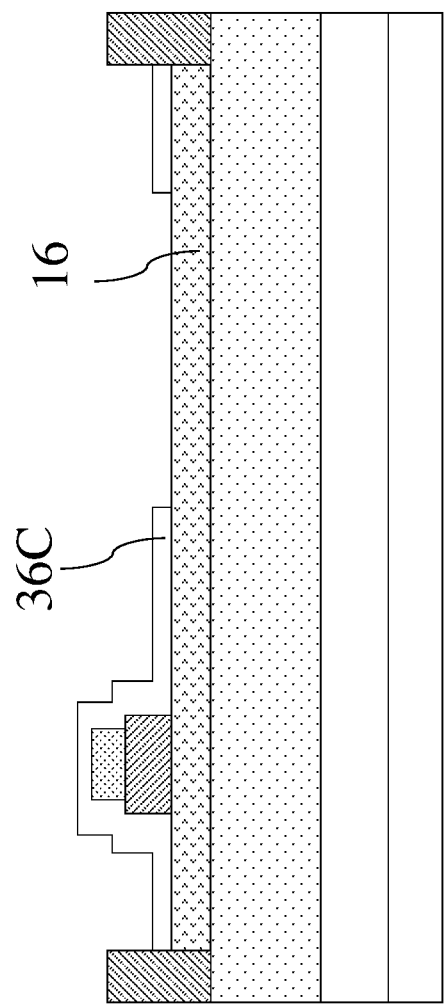

Referring to FIG. 5B, an etching process is performed on the dielectric layer 36. After the etching process, a dielectric layer 36C is formed. The dielectric layer 36C has an opening to expose a part of a top surface of the nitride-based semiconductor layer 16.

Figure 5C:
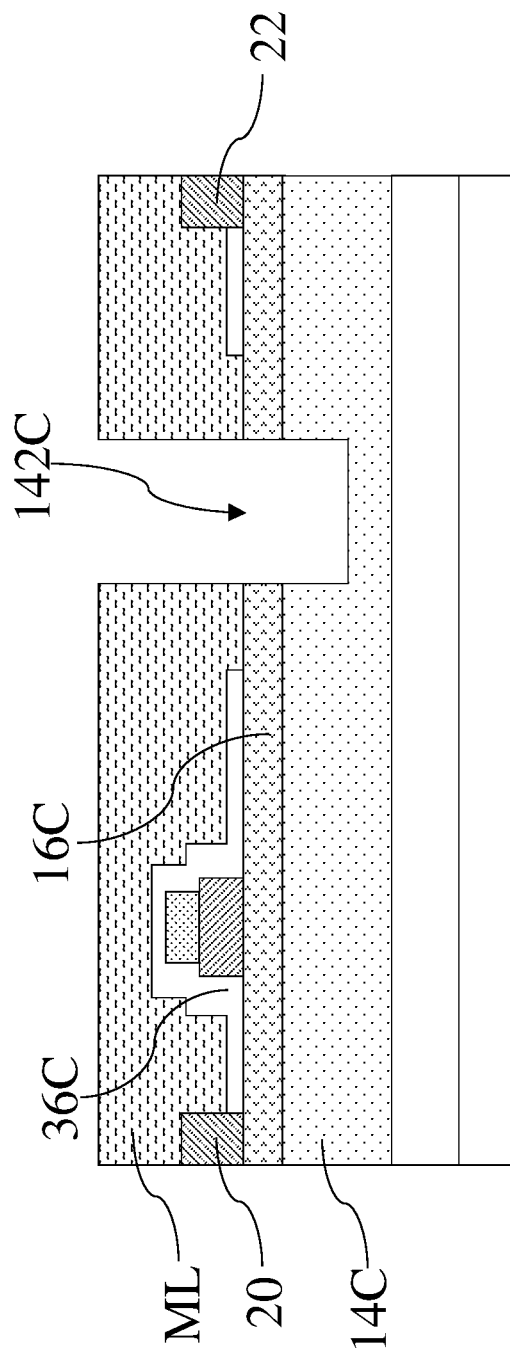

Referring to FIG. 5C, a mask layer ML can be formed on the electrodes 20 and 22, and the dielectric layer 36C. An etching process is performed on/applied to the nitride-based semiconductor layers 14 and 16 by using the mask layer ML, and thus portions of the nitride-based semiconductor layers 14 and 16 are removed. After the etching process, nitride-based semiconductor layers 14C and 16C are formed. At least one trench 142C is formed on the nitride-based semiconductor layer 14C.

Figure 5D:
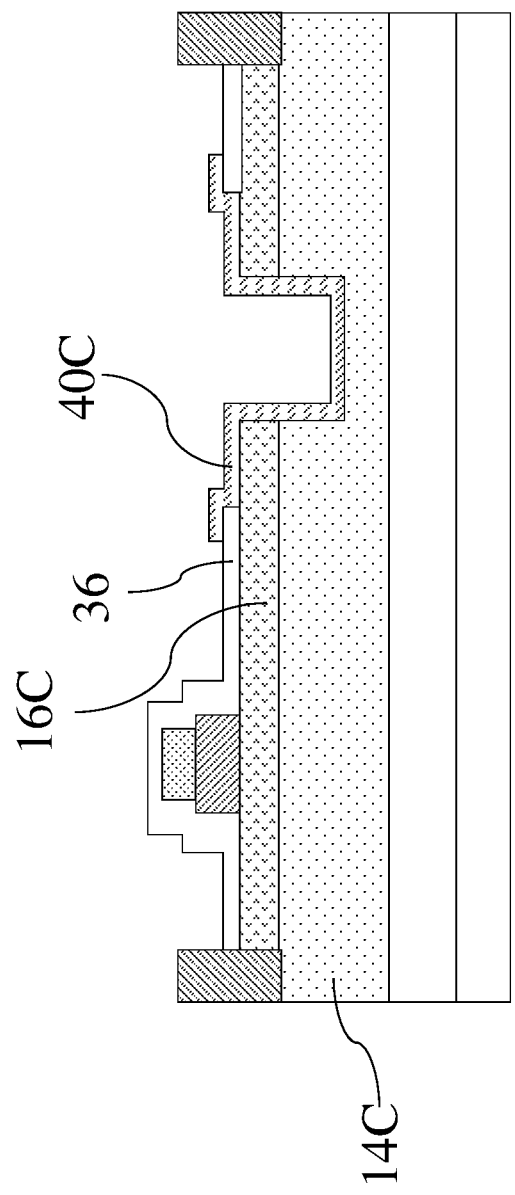

Referring to FIG. 5D, the mask layer ML is removed. A blanket nitride-based semiconductor layer can be formed on/over/above the dielectric layer 36, electrodes 20 and 22, and the nitride-based semiconductor layers 14C and 16C. An etching process is performed on the blanket nitride-based semiconductor layer, so as to remove excess portions thereof, thereby forming a nitride-based semiconductor layer 40C. Thereafter, field plates 50, 52 and 54, and the passivation layer 60 are formed on the resultant structure, so as to obtain the structure as shown in FIG. 4.

Based on the above description, in the embodiments of the present disclosure, the channel layer is provided with at least one trench, such that at least one zone of the 2DEG region therein can distribute along a depth direction (e.g., vertical direction) of the trench, which differs from a horizontal direction. Therefore, the length of the overall 2DEG region increases without enlarging the dimension of the device. By increasing the length of the overall 2DEG region, the withstand voltage ability of the semiconductor device is improved. As such, the semiconductor device can have the improved withstand voltage ability with the volume thereof maintained, which can meet the trend of miniaturization of electronic devices.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
    a first nitride-based semiconductor layer having at least one trench;
    a second nitride-based semiconductor layer disposed on the first nitride-based semiconductor layer and spaced apart from the trench, wherein the second nitride-based semiconductor layer has a bandgap higher than a bandgap of the first nitride-based semiconductor layer;
    a source electrode and a drain electrode disposed above the second nitride-based semiconductor layer;
    a gate electrode disposed above the second nitride-based semiconductor layer and between the source and drain electrodes, so as to at least define a drift region between the gate electrode and the drain electrode and overlapping with the trench;
    a third nitride-based semiconductor layer at least disposed in the trench and extending upward from the trench to make contact with the second nitride-based semiconductor layer, wherein the third nitride-based semiconductor layer has a bandgap higher than the bandgap of the first nitride-based semiconductor layer; and
    a dielectric layer disposed above the second nitride-based semiconductor layer and covers the gate electrode, wherein the third nitride-based semiconductor layer further extends upward to a position higher than the dielectric layer.

2. The semiconductor device of claim 1, wherein the third nitride-based semiconductor layer is conformal with a profile of the trench.

3. The semiconductor device of claim 1, further comprising:
    a passivation layer disposed over the second nitride-based semiconductor layer and the third nitride-based semiconductor layer and having a protruding portion within the trench, wherein the trench is fully filled by the passivation layer and the third nitride-based semiconductor layer.

4. The semiconductor device of claim 1, wherein the second nitride-based semiconductor layer and the third nitride-based semiconductor layer have the same group III element, and a concentration of the group III element contained in the second nitride-based semiconductor layer is less than a concentration of the group III element contained in the third nitride-based semiconductor layer.

5. The semiconductor device of claim 1, wherein the first nitride-based semiconductor layer and the third nitride-based semiconductor layer form a heterojunction therebetween in the trench.

6. The semiconductor device of claim 5, wherein the first nitride-based semiconductor layer and the third nitride-based semiconductor layer collectively form a two-dimensional electron gas (2DEG) region adjacent to the heterojunction and distributed along a vertical direction.

7. The semiconductor device of claim 1, wherein the third nitride-based semiconductor layer extends upward from the trench to a position higher than the second nitride-based semiconductor layer.

8. The semiconductor device of claim 1, wherein the third nitride-based semiconductor layer further extends upward to a position higher than the gate electrode.

9. The semiconductor device of claim 1, wherein the third nitride-based semiconductor layer extend to cover side surfaces of the second nitride-based semiconductor layer and the dielectric layer which abut against each other.

10. The semiconductor device of claim 1, wherein the dielectric layer has a side surface spaced apart from a side surface of the second nitride-based semiconductor layer by a top surface of the second nitride-based semiconductor layer.

11. The semiconductor device of claim 10, wherein the third nitride-based semiconductor layer extend to cover the side surface and the top surface of the second nitride-based semiconductor layer and the side surface of the dielectric layer.

12. The semiconductor device of claim 10, wherein the second nitride-based semiconductor layer and the third nitride-based semiconductor layer are directly stacked on the first nitride-based semiconductor layer and adjacent to the trench.

13. The semiconductor device of claim 1, wherein the first nitride-based semiconductor layer has two or more trenches between the gate electrode and the drain electrode.

14. The semiconductor device of claim 13, wherein the first nitride-based semiconductor layer has a portion between the two or more trenches, and the second nitride-based semiconductor layer has an island on the portion of the first nitride-based semiconductor layer.

15. A method for manufacturing a semiconductor device, comprising:
    forming a first nitride-based semiconductor layer disposed over a substrate;
    forming a second nitride-based semiconductor layer on the first nitride-based semiconductor layer;
    forming a source electrode, a drain electrode, and a gate electrode over the first nitride-based semiconductor layer;
    forming a dielectric layer over the second nitride-based semiconductor layer to at least cover the gate electrode;
    removing portions of the dielectric layer, the first nitride-based semiconductor layer, and the second nitride-based semiconductor layer so as to form at least one trench on the first nitride-based semiconductor layer; and
    forming a third nitride-based semiconductor layer at least within the trench and connecting with the second nitride-based semiconductor layer.

16. The method of claim 15, wherein removing portions of the dielectric layer, the first nitride-based semiconductor layer is performed by applying an etching process.

17. The method of claim 16, wherein the etching process is performed such that two or more trenches are formed on the second nitride-based semiconductor layer.

18. The method of claim 15, wherein the third nitride-based semiconductor layer is formed to extend laterally on the dielectric layer.

19. The method of claim 15, wherein the third nitride-based semiconductor layer is formed to directly stack on the second nitride-based semiconductor layer.

* * * * *